United States Patent [19]
Busanovich et al.

[11] 3,947,717
[45] Mar. 30, 1976

[54] PHOTOCONDUCTOR OF CADMIUM SELENIDE AND ALUMINUM OXIDE

[75] Inventors: Charles John Busanovich; John Theodore Fischer, both of Princeton; Robert Milton Moore, Rocky Hill; John A. van Raalte, Princeton, all of N.J.

[73] Assignee: RCA Corporation, New York, N.Y.

[22] Filed: Mar. 31, 1975

[21] Appl. No.: 563,681

[52] U.S. Cl. .................................. 313/386; 313/94
[51] Int. Cl.² ..................... H01J 29/45; H01J 31/38
[58] Field of Search .............. 313/386, 385, 384, 94

[56] References Cited
UNITED STATES PATENTS

| | | |
|---|---|---|
| 3,238,062 | 3/1966 | Sunners et al. ................ 313/385 X |
| 3,486,059 | 12/1969 | Kiuchi et al. ...................... 313/385 |
| 3,816,787 | 6/1974 | Shimizu et al. ...................... 313/94 |

Primary Examiner—Robert Segal
Attorney, Agent, or Firm—Glenn H. Bruestle; Robert J. Boivin

[57] ABSTRACT

A low dark current photoconductive body includes an aluminum oxide overlayer on a cadmium selenide base layer. A transition region is provided at the interface region between the base layer and the overlayer and consists of a graded transition of cadmium and selenium with increasing amounts of aluminum and oxygen. An alternative body is disclosed omitting the overlayer. A blocking contact is provided within a portion of the body including the overlayer and/or the transition region.

30 Claims, 9 Drawing Figures

PHOTOCONDUCTOR OF CADMIUM SELENIDE AND ALUMINUM OXIDE

BACKGROUND OF THE INVENTION

This invention relates to cadmium selenide photoconductive devices and more particularly to photoconductive devices employing cadmium selenide bodies which include a blocking contact, or heterojunction, similar in electrical characteristics to a p-n junction.

Cadmium selenide bodies are known which display high photosensitivities when employed in photoconductive light sensitive devices. This and other advantages makes such cadmium selenide bodies particulary desirable for use in photoconductive imaging devices such as camera tubes, or as coatings for electrophotographic plates. Unfortunately, unstable and/or high dark currents normally associated with such prior art photoconductive bodies, have precluded their general commercialization in light sensitive devices.

Recently, researchers in the field of cadmium selenide photoconductors have sought to improve the dark current characteristics associated with cadmium selenide bodies by incorporating an overlayer of cadmium salt of oxy-acid on a base layer of cadmium selenide by somewhat complicated processing methods. The purpose of this overlayer is to stablilize and reduce the dark current by forming a blocking contact to electrons within the body whereby the body may be depleted in a manner analogous to a p-n junction. Such a photoconductor body is, for example, described in U.S. Pat. No. 3,816,787, issued to K. Shimizu et al. on June 11, 1974. Alternative cadmium selenide bodies having low and stable dark current characteristics are, however, desired wherein less complicated methods may be employed for their manufacture.

SUMMARY OF THE INVENTION

A low dark current photoconductive body includes in a direction of thickness between opposed surfaces: (1) a first material region substantially of cadmium selenide, and (2) a second material region substantially of aluminum oxide. A transition region is provided at the interface between the first and second material regions which consists of a graded transition of cadmium and selenium with increasing amounts of aluminum and oxygen. An alternative body is disclosed wherein the second material region is omitted. A blocking contact is provided within a portion of the body including the second material region and/or the transition region.

DESCRIPTION OF THE PREFERRED EMBODIMENTS

Figures 1, 2, 5, 8, 9:
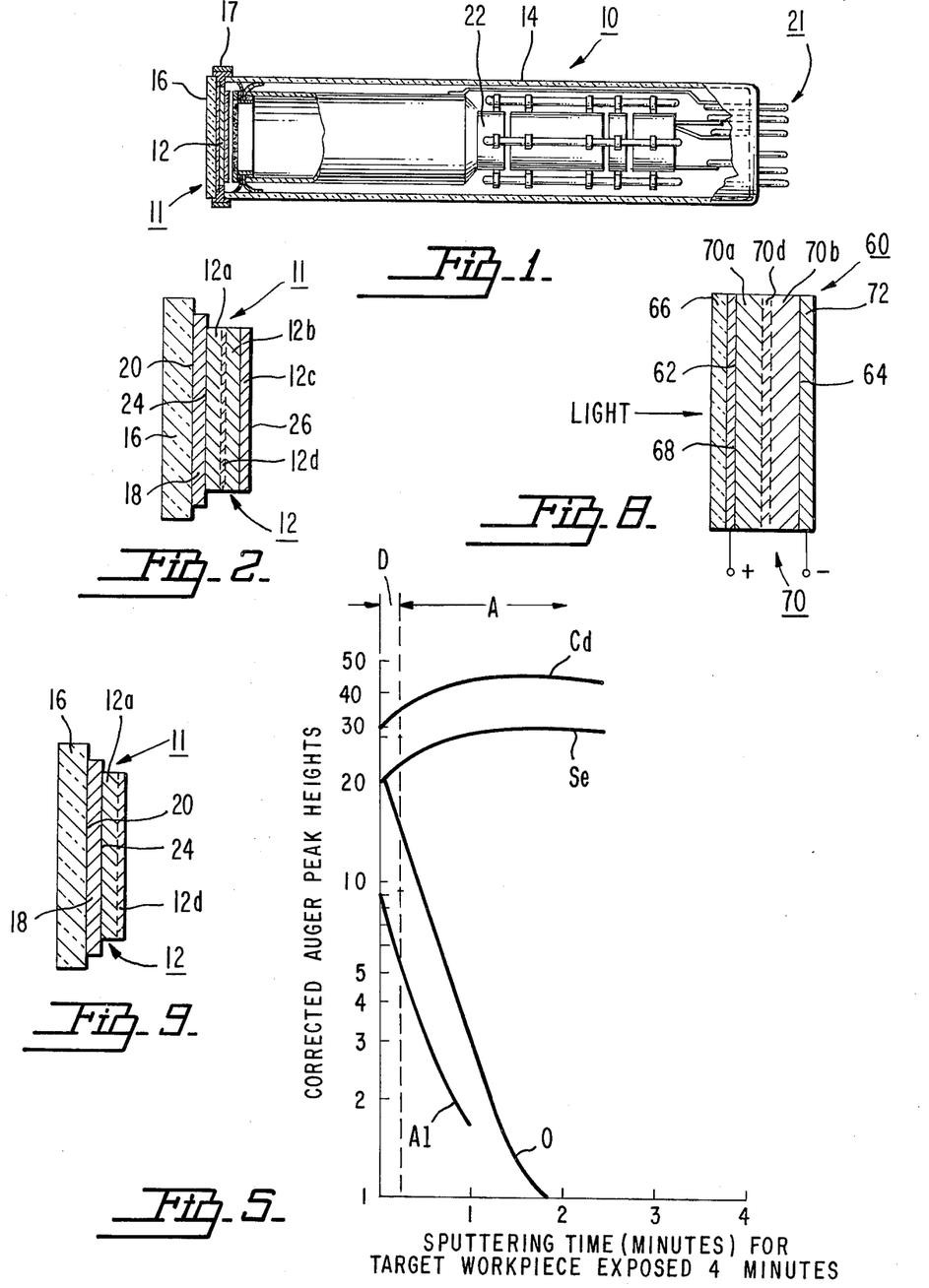
FIG. 1 is a cross-sectional view of a typical vidicon-type camera tube including a preferred target in accordance with the invention.
FIG. 2 is an exaggerated cross-sectional view of a preferred target of the tube of FIG. 1.
FIG. 5 and FIG. 6 graphically depict Auger spectroscopy chemical depth profiles for two similar photoconductive bodies made in accordance with the invention but subjected to differing exposure periods within the apparatus depicted in FIG. 3.
FIG. 8 is an exaggerated cross-sectional view of an alternative structural arrangement of a target in accordance with the invention.
FIG. 9 is an exaggerated cross-sectional view of an alternative target in accordance with the invention.

Referring to FIG. 1, there is shown a vidicon-type camera tube 10 wherein a target 11 is mounted at one end of an evacuated elongated tubular envelope 14. A transparent faceplate 16 is hermetically sealed to the target end of the envelope 14 by means of a conductive sealant ring 17.

Referring to FIG. 2, the target 11 is shown in greater detail. The target 11 includes: transparent conductive coating 18 which is formed along an inner surface 20 of the faceplate 16 and a photoconductive body 12 which is fabricated along a major surface of coating 18 opposite to the surface in contact with the faceplate 16. A conductive sealant ring 17 (FIG. 1) of, for example, indium makes electrical contact to the coating 18 of the target 11 and provides, together with an electron beam forming and scanning means 22 (FIG. 1), a means of externally applying an electrical potential across opposed surfaces 24 and 26 of the body 12. The electron beam forming and scanning means 22 includes necessary electrodes, fixably mounted and secured within the elongated interior of the envelope 14, for producing and scanning an electron beam along a path across the exposed major surface 26 of the body 12. A plurality of electrical lead-in pins 21 (FIG. 1) are hermetically sealed through a stem portion of an end of envelope 14 opposite to the target 11. The pins 21 are electrically connected to respective ones of the electrodes internally within the envelope 14 in a manner well known in the art.

Referring to FIG. 2, the photoconductive body 12 comprises in a direction of thickness progressing from the major surface 24 to the other opposed major surface 26: (1) a first material region 12a substantially of n-type cadmium selenide; (2) a second material region 12b consisting of an insulating overlayer substantially of aluminum oxide; and (3) a third material region 12c consisting of a high resistance chalcogenide compound having a resistivity exceeding $10^8$ ohm-cm.

A transition region 12d is provided at the interface region between the first and second material regions 12a and 12b and comprises a thin graded transition of the materials and/or the individual elements of the abutting first and second regions 12a and 12b.

A semiconductor-insulator blocking contact is within a portion of the photoconductor 12 which consists of the transition region 12d and the overlayer 12b. The "blocking contact" as herein defined constitutes a portion of the photoconductive body 12 having a considerably decreased concentration of majority carriers relative to the majority carrier concentration associated with the first material region 12a, whereby non-photogenerated majority carriers, (i.e. electrons from the electron beam) are substantially blocked or prevented from entering or being conducted into the first material region 12a of the photoconductive body, and whereby photogenerated minority carriers within the first material region 12a may be effectively conducted to combine with the non-photogenerated majority carriers within the second material region 12b. The combined depth or thickness of the second material region 12b and the transition region 12d is preferably selected to stabilize the dark current associated with the operation of the photoconductive body 12 at low values over substantial periods of time exceeding 100 hours. In this regard, the combined thickness of region 12b and region 12d preferably is from approximately 100 Angstroms to approximately 500 Angstroms; however, other thicknesses less than about 5000 Angstroms may be employed to advantage.

In preferred embodiments, the photoconductive body 12 is fabricated or formed on a transparent conductive coating 18 which has been previously deposited along the major surface 20 of the faceplate 16 as shown in FIG. 2. The transparent conductive coating 18 may for example, comprise a tin oxide material, $SnO_2$, which is predeposited on the faceplate 16 by techniques well known in the art.

In the fabrication of the preferred photoconductive body 12 for the tube 10, a 1 to 2 micron thick overlayer of cadmium selenide is first vapor deposited in a vacuum of preferably less than $10^{-5}$ torr on the available major surface of the transparent conductive coating 18 (i.e. the "substrate"), while maintaining the substrate at a temperature within the range of from about 200° C. to about 500° C.

The faceplate or substrate 16 which includes the cadmium selenide overlayer (i.e. the "workpiece") is preferably thereafter treated as for example, by a thermal or baking process to optimize the photoconductive properties of the cadmium selenide. The material composition of region 12a is preferably primarily polycrystalline and preferably includes crystallites of multiple crystallographic phases having substantially uniform cross-sectional dimensions (i.e., diameter or width) of substantially less than 20 microns.

Figures 3, 4:
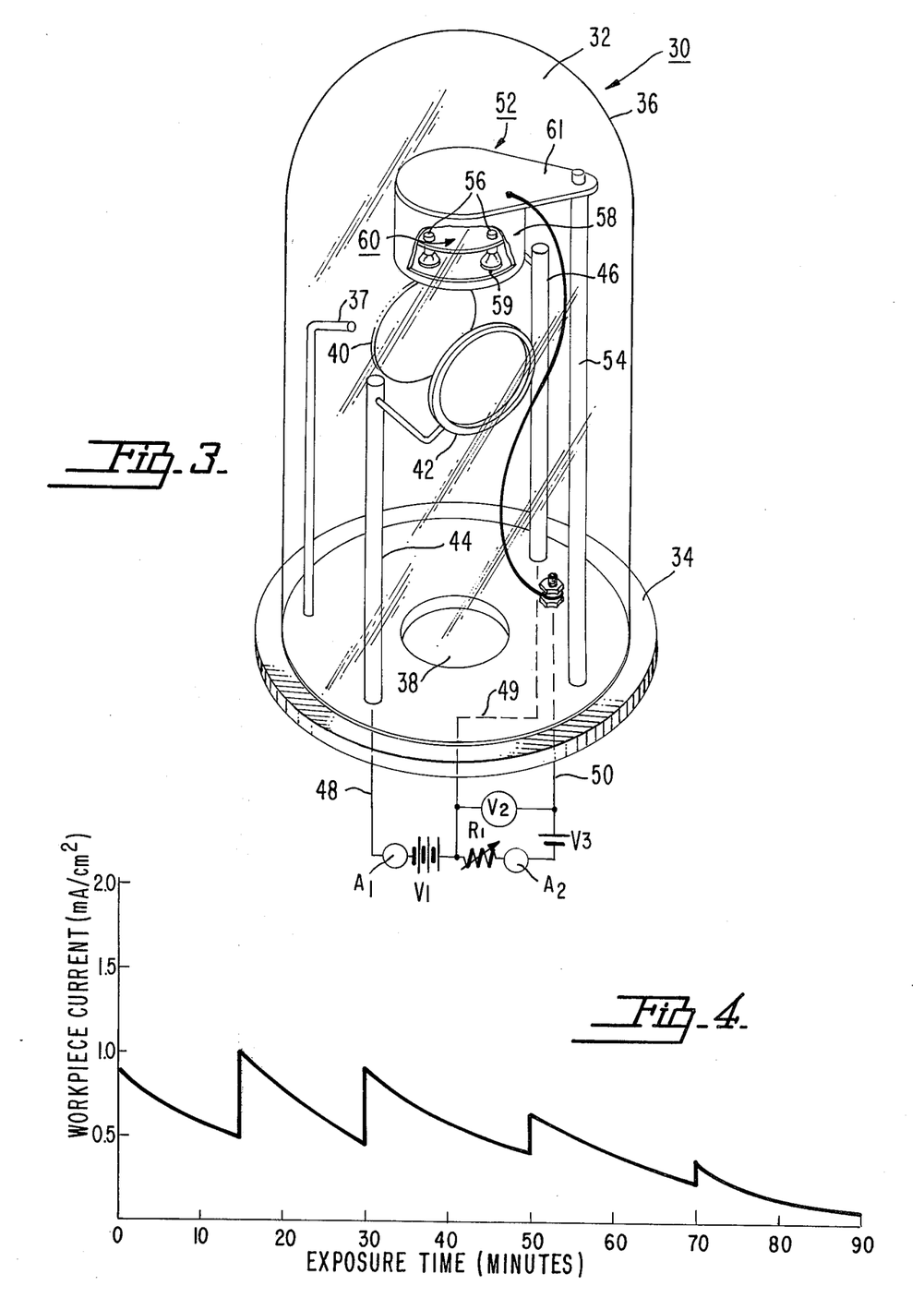
FIG. 3 is a simplified drawing of a reactive sputtering apparatus for fabricating the target.
FIG. 4 is a graph showing a typical workpiece current profile achieved within the apparatus of FIG. 3 over a typical exposure period of 90 minutes.

Referring now to FIG. 3, there is shown a reactive sputtering apparatus for fabricating the photoconductive body 12.

The apparatus 30 includes a cylindrically-shaped dome-like vacuum chamber 32 enclosed by a base plate 34 and a bell jar 36. A platinum plate anode electrode 40 is vertically mounted within the chamber 32 in substantially parallel spaced relation from an aluminum ring cathode electrode 42 by vertical support posts 46 and 44, respectively. A workpiece holder 52 is fixably mounted in a horizontal plane perpendicular to the vertical planes along which the respective electrodes 40 and 42 are positioned. The workpiece holder 52 comprises an insulated enclosure including a hollowed bottom or cup-like portion 58.

During fabrication, a plurality of target workpieces 59, each of which consists of a faceplate 16 including the tin oxide coating 18 and the cadmium selenide overlayer 12a (fabricated as previously described), are positioned within the interior of the cup-like portion 58. Each workpiece 59 is positioned such that a surface portion of the first material region 12a of each workpiece 59 is substantially in aligned relation with one of a plurality of mask-like through-openings, or apertures, (not shown) extending through the bottom of the cup-like portion 58. A spring assembly 60, including workpiece holder members 56, is positioned within the cup-like portion 58 to secure and retain the aligned workpiece 59 therein and to make electrical contact to their respective transparent conductive coatings 18. Thereafter, a top plate 61 is secured to the upper lip of the cup-like portion 58 and the assembled workpiece holder 52 is thereafter fixably positioned within the chamber 32 by means of interconnected vertical support post 54.

The unmasked cadmium selenide surface portions of each of the workpieces 59 are preferably positioned or aligned along a plane which is parallel to a central axis passing through the disc-like platinum plate 40 and aluminum ring 42, but displaced therefrom by a perpendicular distance of approximately 15cm.

After the workpieces 59 are mounted within the workpiece holder 52, as previously described, the bell jar 36 is placed in registry with the base member 34 to form therewith a vacuum seal (not shown). The chamber 32 is then evacuated by means of an evacuation system connected to an exhaust port 38 in a manner well known in the art to a pressure level of preferably less than $10^{-2}$ torr. A direct current voltage of from about 600 to about 1500 volts D.C. is then applied between anode and cathode electrodes 40 and 42 (via electrical leads 49 and 48, respectively) by means of a voltage source $V_1$. Thereafter, oxygen is introduced through an oxygen inlet 37 into the chamber 32 until a suitable plasma current level (i.e. the current level through meter $A_1$) is established within the chamber 32. A plasma current level of about 56 milliamperes is preferred; however, the current may be varied to advantage depending upon the size and configuration of the anode and cathode electrodes 40 and 42 and the level of electron emission desired from the cathode electrode 42. A total or partial pressure of oxygen within chamber 32 within the range of from about 0.1 to about 0.5 torr has been found to be particularly desirable. A plasma cloud or glow discharge field region composed of ions of oxygen is created between the electrodes 40 and 42, and about their peripheral edges. A variable voltage is thereafter applied between the coating 18 of each of the workpieces 59 and the anode electrode 40 by an electric circuit arrangement including a voltage source $V_3$, as shown in FIG. 3. Electrons released during glow discharge are thereafter accelerated to impinge or bombard each of the exposed, or unmasked cadmium selenide surface portions of the workpieces 59. Similarly, any negative oxygen ions which may be formed during glow discharge are also accelerated and bombard the unmasked surface portions of the workpieces 59.

The variable voltage applied between coating 18 of each workpiece 59 and the electrode 40 may be generated, as shown in FIG. 3, by means of the voltage source $V_3$ in series with a variable resistor $R_1$. The voltage of the source $V_3$ is preferably approximately 25 volts D. C. The resistance of $R_1$ is selected to provide effective adjustable control of a current through source $V_3$ between the cathode electrode 42 and workpieces 59 at a level measured by the meter $A_2$. The current level through meter $A_2$ is preferably controlled at an effective level whereby the respective exposed unmasked surfaces of the workpieces 59 are sufficiently bombarded by electrons to provide proper conditioning or activation of each of those surfaces to form a blocking contact. In this regard, current level $A_2$ is preferably maintained or stabilized, at a level or average value per unit of exposed or unmasked surface area of the workpieces 59, less than about 1 milliampere per $cm^2$.

Referring to FIG. 4, there is graphically shown current profile of preferred and substantially stable workpiece current levels in mA./cm.$^2$ of exposed workpiece area measured on meter $A_2$ for a typical exposure period of 90 minutes.

Exposure of the workpieces 59 within the apparatus 30 provides controlled electron bombardment of each unmasked workpiece surface portion during the simultaneous "reactive" sputter deposition of aluminum and oxygen along each bombarded surface. Atoms of aluminum and oxygen, or aluminum oxide molecules, are continually deposited along the exposed unmasked surface portions of each workpiece 59 to a controlled depth related to the length of time of that sputter exposure or deposition period (hereinafter "exposure period").

It is believed that the controlled electron bombardment of the exposed unmasked surface portions of the workpieces 59 within the apparatus 30 "reactively" conditions those surfaces by, for example, cleaning and/or removing undesirable surface oxides, or other surface contaminants, and also possibly provides a controlled heating or activation of those surfaces, essential to the fabrication of the blocking contact within the second material region 12b and/or the transition region 12d.

Furthermore, a controlled interdiffusion of the material or elements in the region of the interface between the cadmium selenide region 12a and the sputter deposited overlayer of aluminum and oxygen occurs whereby the transition material region 12d is fabricated. If the exposure period is continued for a sufficient length of time, a region 12b substantially of aluminum oxide is fabricated over the transition region 12d. The workpieces 59 are preferably exposed within the apparatus 30, as described above, for a period of time of from about 1 to about 3 hours. Other exposure periods may be employed to advantage; however, the time period of exposure should be adequate to provide for the formation of a stable and effective blocking contact (i.e. a blocking contact having stable relatively low dark current characteristics of less than about 20 nanoamperes) over substantial operating periods of time in excess of 100 hours. In this regard, a preferred period of exposure for the target 11 is believed to correspond to the time period necessary to achieve a thickness of the second material region 12b which exceeds approximately 100 Angstroms.

Figure 6:
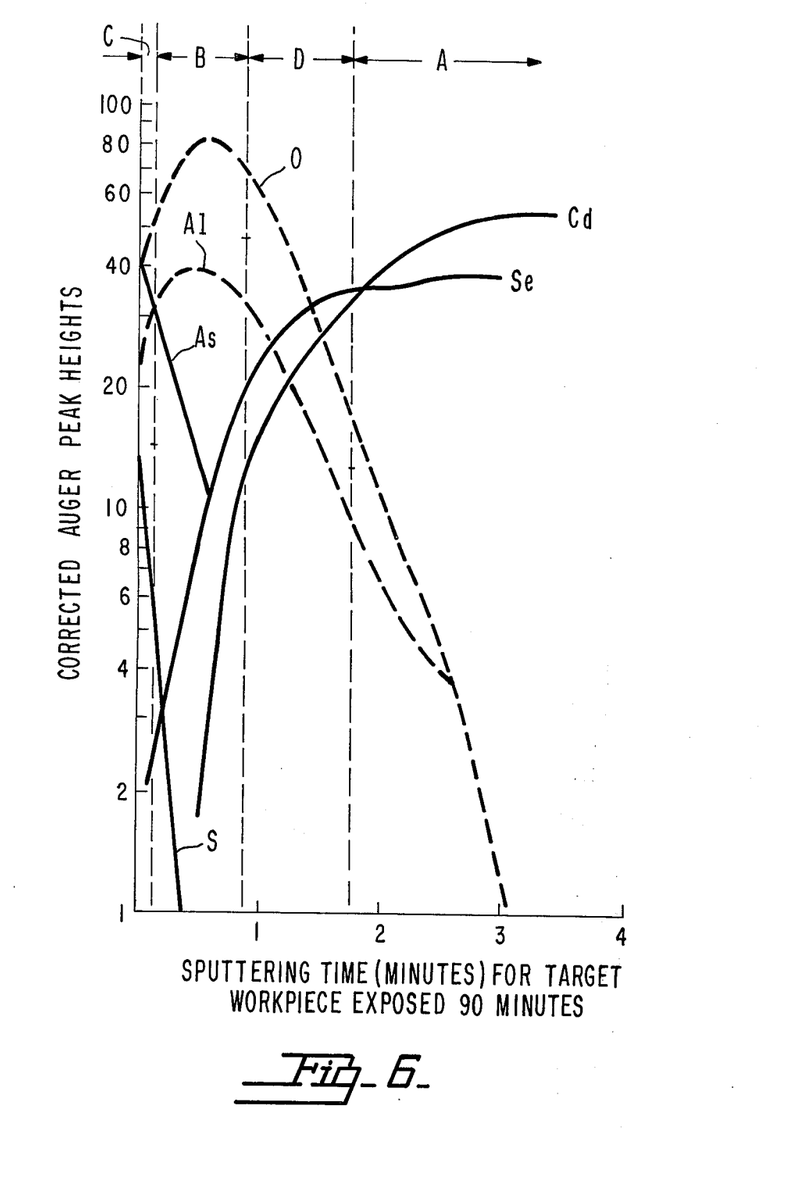

Referring to FIGS. 5 and 6, there is graphically depicted a chemical depth profile of two substantially similar photoconductive bodies made in accordance with the invention, in which differing exposure periods of 4 minutes and 90 minutes, respectively, were employed within the apparatus 30. The chemical depth profiles depicted in FIGS. 5 and 6 were obtained by Auger spectroscopy methods employing ion milling (i.e. the sputtering off of surface atoms). Such analytical techniques are known in the art and are thoroughly referenced in "Analytical Auger Electrospectroscopy" by Chuan C. Chang, in the book entitled *Characterization of Solid Surfaces*, edited by P. F. Kane and G. B. Larrabee, N.Y., Plenum Press, 1974, on pages 509-576. Each of the samples depicted in FIGS. 5 and 6 was tested to insure operability as a vidicon target over a period of time of less than 30 minutes prior to analysis to avoid distruction of the target as a consequence of the testing or analysis procedure.

Ion milling of the respective target samples depicted in FIGS. 5 and 6 was accomplished at a sputtering rate of approximately 50 Angstroms per minute (assuming a unity yield). However, because of possible deviations or variations in sputtering, or "ion milling," rates associated with the various atomic or elemental compositions of the respective samples at various levels, the sputtering rate or ion milling rate conceivably may have varied during the analysis within the range of from about 20 Angstroms per minute to about 100 Angstroms per minute during the overall depth profile analysis. In FIGS. 5 and 6, there are graphically shown, along the ordinate axis, the "Corrected Auger Peak Heights" which were obtained for the various detectable chemical elements after specified sputtering or ion milling periods (shown along the abcissa axis) for each of the respective target samples being analyzed. An analysis of the data used to generate FIGS. 5 and 6 indicates that the Aluminum Auger line (e.g. 1396eV.) is shifted downward by about 10eV. in energy which is highly indicative of the oxide form of aluminum, that is $Al_2O_3$.

In order to facilitate a uniform comparison of the data presented in FIGS. 5 and 6, and for establishing a consistent approach for evaluating other structures of similar construction, various ones of the material regions comprising the respective structures are divided, as shown in FIG. 6, into specific material regions having thicknesses approximately delineated by the designations "A," "B," "C," and "D" which are uniquely associated with the regions 12a–12d, respectively. The boundary divisions between respective material regions of each of the structures of FIGS. 5 and 6 were consistently located substantially at a vertical line of reference wherein an average of the two primary minor elements approximately equaled 33 percent of the average of the two major or predominating elements. Thus, in FIG. 6, the boundary between region 12b and 12d (i.e. between B and D) was located at the line of reference where the average of the Corrected Auger Peak Heights associated with the minor elements of Cadmium and Selenium (about 16 ½) was approximately 33 percent of the average of the Corrected Peak Heights associated with Aluminum and Oxygen (about 50). Vertical boundaries were also similarly established between regions 12d and 12a and between region 12b and 12c of the sample depicted in FIG. 6. With respect to FIG. 5, a single vertical boundary is shown between a region 12a and a region 12d, for the sample therein depicted, inasmuch as the exposure period for that sample (4 minutes) within the apparatus 30 was substantially shorter than that necessary to form the region 12b in the manner previously described. Targets fabricated in this fashion have the structure shown in FIG. 9, wherein corresponding designation numbers are employed to designate similarities with the target depicted in FIG. 2. The target of FIG. 9 does not include the third material region 12c. Moreover, the target of FIG. 9 includes only an extremely thin transition region 12d of less than about 100 Angstroms in thickness. A target sample fabricated in this fashion was tested and found to include a blocking contact whereby substantially lower values of dark current were achieved over short periods of operation as a vidicon target. On the other hand, target samples similar to that depicted in FIG. 6 have been tested for longer periods and found to retain substantially stable and low dark current characteristics over substantial periods of time in excess of 100 hours and even approaching, or exceeding, operating periods of 1000 hours. It is believed that the incorporation of a transition region 12d and a second material region 12b (such as depicted in FIG. 6), substantially of aluminum oxide $Al_2O_3$, having a combined thickness exceeding about 100 Angstroms is particularly preferred for avoiding the degradation or deterioration of the blocking contact over longer operating periods of time, as vidicon targets, exceeding 100 hours. Alternative structures, such as that depicted in FIG. 9, may be employed in later described embodiments to particular advantage wherein only an extremely thin transition region 12d is required along the exposed unmasked surface of the workpieces 59 without the necessity of the additional region 12b. The inclusion of the third material region 12c along region 12d or 12b, may also assist in stabilizing dark current characteristics over long operating periods.

The material region 12c of the target 11 is preferably included as a portion of photoconductive bodies which are fabricated for use as vidicon targets, however its inclusion is not critical to the inventive concept herein disclosed. The material composition of region 12c preferably consists of a chalcogenide of high resistance (i.e. greater than about $10^8$ ohm-cm.) having a secondary emission coefficient of less than unity at typically employed target operation voltages (e.g. 5 volts to 50 volts). Undesirable charging of the scanned surface of the target 11 as a consequence of secondary emission is thereby substantially avoided. Also, the high resistivity of the material region 12c, minimizes lateral leakage of charge along the scanned surface of the target 11 thereby substantially preserving for suitable periods of time the charge intensity pattern or charge image replica formed along the blocking contact region 12d. For example, the material of region 12c may comprise a material selected from the group consisting of zinc sulfide, arsenic disulfide, arsenic trisulfide, arsenic triselenide, thallium sulfide, thallium selenide, zinc selenide, cadmium telluride, antimony trisulfide, antimony triselenide, and mixtures thereof.

In the operation of the vidicon 10, (FIG. 10) suitable voltages are applied to the lead-in pins 21 and the ring 17 in a manner well known in the art. During operation, a light image from the viewed scene passes through the faceplate 16 and the transparent conductive coating 18 and generates electron-hole carrier pairs in the first material region 12a of photoconductive body 12 in accordance with the intensity pattern of light from the viewed scene. The blocking contact within the target 11 substantially prevents electrons from being injected or conducted from the electron beam into the cadmium selenide first material region 12a. In contrast, photogenerated holes within the region 12a sweep across the first material region 12a of the body 12 and eventually recombine with electrons accumulated along the opposite portion of the photoconductive body 12 which abuts the blocking contact, thereby reducing the electrical charge along that portion in accordance with the light intensity pattern of the viewed scene. The photogenerated electrons are conducted away from the target 11, by means of the transparent conductive layer 18 and by the sealant ring 17, to a suitable source of electrical potential connected thereto.

Figure 7:
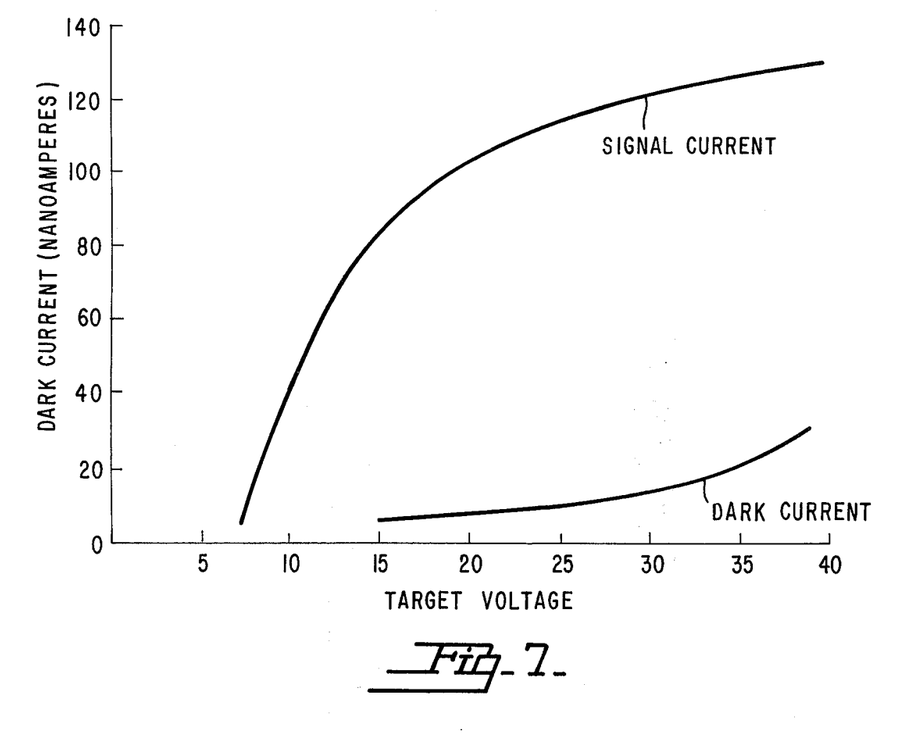
FIG. 7 is a graph displaying the dark current characteristics at various target operating voltages of a preferred embodiment of a target substantially as shown in FIG. 2.

In the operation of the target 11 within a vidicon such as depicted in FIG. 1, relatively high sensitivities have been achieved at relatively low target operating voltages (i.e., 15 volts to 30 volts). Furthermore, novel targets fabricated in the preferred manner display stable and low dark currents at such operating voltages of less than 10 nanoamperes for periods of time exceeding 100 hours. Referring to FIG. 7 there is shown a graph comparing the signal current and dark current characteristics of a typical vidicon which incorporates a preferred embodiment of the target 11, fabricated as previously described, relative to various operating voltages.

While the photoconductive body 12 may be fabricated as described above for use as a vidicon target 11, a number of alternative and particularly useful photoconductive devices may be similarly fabricated. For example, in its simplest form a photoconductive device may be fabricated in the manner similar to that of the structure depicted in FIG. 2 either as a photodiode or as an electrophotographic imaging plate 60 as shown in FIG. 8. An alternative simpler construction of a photodiode or electrophotographic plate might also be employed having a structure similar to that depicted in FIG. 9, effectively omitting the second and third material regions analogous to regions 12b and 12c.

Referring specifically to FIG. 8, photoconductive body 70 includes first and second material regions 70a and 70b, analogous in function to the first and second material regions 12a and 12b, respectively, described above with regard to FIGS. 1 and 2. A transition region 70d is fabricated between the first and second material regions 70a and 70b of the device 60 analogous in function to the transition region 12d previously described. A blocking contact is also provided within the transition and second material regions 70d and 70b as previously described. Preferably, the photoconductive body 70 is fabricated by the methods previously described with regard to the vidicon target 11, with minor variations herein described.

In the embodiment shown in FIG. 8, electrical contact is established to the opposed major surfaces 62 and 64 of the photoconductive body 70 by means of a pair of contacting electrodes 68 and 72 respectively. The electrode 68 may, for example, comprise a transparent conductive coating, such as tin oxide, $SnO_2$, deposited along a transparent supporting substrate 66 of, for example, glass in a manner similar to that previously described for the target 11. The electrode 72 may comprise, for example, a removable metal contacting plate.

With the diode structure shown in FIG. 8, the electrical conductivity of the device 60 varies in accordance with the intensity of light impinging upon the photoconductive body 70 through the transparent electrode 68. In alternative structures, the electrode 68 may comprise a self-supporting metal electrode in ohmic contact with the photoconductive body 70, in a manner well known in the art, thereby avoiding the need for the substrate 66.

Unlike the vidicon 10 previously described, a photodiode such as shown in FIG. 8 does not require a third material region 70c, analogous to the region 12c of FIG. 2, for the reason that an electron injection contact is provided by the electrode 72 which is in direct electrical contact wtih the photoconductive body 70. The third material region 12c is preferred only for structures employing an electron beam contact for establishing a charge pattern within the portion of the photoconductive body abutting the blocking contact.

The photoconductive body 70 may also be used as an imaging plate of an electrophotographic device. For such use, a negative charge of electrical potential is placed across the surface 64 of the photoconductive body 70. This can be achieved by placing the metal electrode 72 temporarily in contact with a surface of the material region 70b, and by applying a bias between that electrode and the electrode 66. Because of the semiconductor-insulator locking contact within the transition and second material regions, 70d and 70b, electrons are trapped and accumulated along a portion of the photoconductive body abutting the blocking contact.

The photoconductive body 70 is then exposed to a light image from the scene being photographed, such as a printed page. The light image of the viewed scene is focussed to impinge upon either major surface 62 and 64 of the body 70 through the transparent electrode 68, or alternatively after removal of the electrode 72. The light from the image enters the body 70 to generate electron-hole carrier pairs within the first material region 70a. Photogenerated holes travel through the transition material region 70d and the blocking contact to recombine with electrons accumulated along the abutting portion of the photoconductive body 70. This leaves a residual pattern of accumulated charge carriers along the portion of the photoconductive body 70 abutting the blocking contact opposite region 70a, which is substantially a charge replica of the image of the scene being photographed.

A source of ink particles is passed over the second material region 70b in a structure wherein the contacting electrode 72 may be temporarily moved. The ink particles are attracted to the exposed surface portions of the material region 70b which are charged by the accumulated negative charge so as to provide an ink pattern along its surface. The ink pattern is then transferred to a permanent support, such as a sheet of paper, and is bonded thereto, such as by heating.

Unlike prior art cadmium selenide electrophotographic plates, the novel above-described employs a photoconductive body having particularly desirable characteristics such as, for example, highly stable dark current and low operating voltage.

What we claim is:

1. A photoconductive device comprising:
   a. a photoconductive body including in a direction of thickness:
      1. a first material region substantially of n type electrical conductivity cadmium selenide;
      2. a second material region substantially of aluminum oxide;
      3. a transition region along an interfacing region between said first and second material regions consisting of a graded atomic transition of the material compositions of said first and second material regions;
   b. a blocking contact within a portion of said photoconductive body including said transition and second material regions;
   c. contacting means for applying an electrical potential across opposed major surfaces of said body whereby charged carriers may be conducted through said body in said direction of thickness in accordance with light impinging on said body.

2. A photoconductive device in accordance with claim 1, wherein said transition region consists of a material having a graded atomic composition, progressing in a direction of thickness from said first to said second material regions, initially of substantially equal amounts of cadmium and selenium substantially as CdSe, to an atomic composition substantially of aluminum and oxygen in the ratio of approximately 2 to 3.

3. The photoconductive device of claim 2, wherein said cadmium selenide is substantially polycrystalline and includes multiple crystallographic phases.

4. The photoconductive device of claim 3, wherein the combined thickness of said second material region and transition region is less than about 5,000 Angstroms.

5. The photoconductive device of claim 4, wherein said body additionally includes a third material region on said second material region consisting of a high resistance chalcogenide compound having a resistivity of greater than $10^8$ ohm-cm.

6. The photoconductive device of claim 5, wherein said high resistance compound consists of a material selected from the group consisting of zinc sulfide, arsenic disulfide, arsenic trisulfide, arsenic triselenide, thallium sulfide, thallium selenide, zinc selenide, cadmium telluride, antimony trisulfide, antimony triselenide, and mixtures thereof.

7. The photoconductive device of claim 1, wherein said contacting means includes an electrically conductive film on one of said major opposed surfaces of said body on said first material region.

8. The photoconductive device of claim 7, wherein said film is transparent.

9. A photoconductive imaging device in accordance with claim 8, wherein said first material region is approximately 1 to 2 microns in thickness, and wherein the combined thickness of said transition and second material regions is from approximately 100 to approximately 500 Angstroms.

10. A camera tube comprising:
   a. an evacuated envelope with a transparent portion,
   b. an electron beam forming and scanning means for scanning an electron beam along a path within the envelope; and
   c. a target mounted within the envelope in the path of the electron beam and including a major surface for receiving a light image transmitted through said transparent portion; the target including:
      1. a photoconductive body including in a direction of thickness:
         i. a first material region substantially of n type electrical conductivity cadmium selenide;
         ii. a second material region substantially of aluminum oxide;
         iii. a transition region along an interfacing region between said first and second material regions consisting of a graded atomic transition of the material composition of said first and second material regions; and
      2. a blocking contact within a portion of said photoconductive body including said transition and second material regions.

11. A camera tube in accordance with claim 10, wherein said transition material region is substantially of contrasting electrical conductivity to that associated with said first material region;
    said transition material region having a graded atomic composition, progressing in a direction of thickness from said first to said second material region, consisting initially of substantially equal amounts of cadmium and selenium to an atomic composition consisting substantially of aluminum and oxygen in the ratio of approximately 2 to 3.

12. A camera tube in accordance with claim 11, wherein the combined thickness of said transition and second material regions is less than about 5,000 Angstroms.

13. A camera tube in accordance with claim 12, wherein said first material region is approximately 1 to 2 microns in thickness, and wherein the combined thickness of said transition and second material regions is from approximately 100 to 500 Angstroms.

14. A camera tube in accordance with claim 11, wherein said cadmium selenide is substantially polycrystalline and includes multiple crystallographic phases.

15. A camera tube in accordance with claim 14, additionally comprising a third material region consisting of an overlayer on said second material region of a high resistance chalcogenide compound having a resistivity of greater than $10^8$ ohm-cm.

16. A camera tube in accordance with claim 15, wherein said high resistance compound consists of a material selected from the group consisting of zinc sulfide, arsenic disulfide, arsenic trisulfide, arsenic triselenide, thallium sulfide, thallium selenide, zinc selenide, cadmium telluride, antimony trisulfide, antimony triselenide, and mixtures thereof.

17. A camera tube in accordance with claim 16, wherein a portion of the surface of said transparent portion within the interior of said envelope includes a transparent electrically conductive film having a major surface in electrical contact with said first material region of said target.

18. A camera tube in accordance with claim 17, wherein said film consists essentially of tin oxide.

19. A photoconductive device comprising:
a. a photoconductive body including in a direction of thickness:
 1. a region substantially of n type electrical conductivity cadmium selenide, and
 2. a transition region abutting said cadmium selenide region substantially of a graded atomic composition, progressing in a direction of thickness away from said cadmium selenide region, of initially cadmium selenide to a composition of cadmium and selenium with increasing amounts of aluminum and oxygen, said transition region including a blocking contact;
b. contacting means for applying an electrical potential across opposed major surfaces of said body whereby charged carriers may be conducted through said body in said direction of thickness in accordance with light impinging on said body.

20. The photoconductive device of claim 19, wherein said cadmium selenide is substantially polycrystalline and includes multiple crystallographic phases.

21. The photoconductive device of claim 20, wherein said body additionally includes along said transition region a region consisting of a high resistance chalcogenide compound having a resistivity of greater than $10^8$ ohm-cm.

22. The photoconductive device of claim 21, wherein said high resistance compound consists of a material selected from the group consisting of zinc sulfide, arsenic disulfide, arsenic trisulfide, arsenic triselenide, thallium sulfide, thallium selenide, zinc selenide, cadmium telluride, antimony trisulfide, antimony triselenide, and mixtures thereof.

23. The photoconductive device of claim 22, wherein said contacting means includes an electrically conductive film on one of said major opposed surfaces of said body on said first material region.

24. The photoconductive device of claim 23, wherein said film is transparent.

25. A camera tube comprising:
a. an evacuated envelope with a transparent portion,
b. an electron beam forming and scanning means for scanning an electron beam along a path within the envelope; and
c. a target mounted within the envelope in the path of the electron beam and including a major surface for receiving a light image transmitted through said transparent portion; the target including:
 1. a photoconductive body including in a direction of thickness;
  i. a region substantially of n type electrical conductivity cadmium selenide;
  ii. a transition region abutting said cadmium selenide region substantially of a graded atomic composition, progressing in a direction of thickness away from said cadmium selenide region, of initially cadmium selenide to a composition of cadmium and selenium with increasing amounts of aluminum and oxygen, said transition region including a blocking contact.

26. A camera tube in accordance with claim 25, wherein said transition material region is substantially of contrasting electrical conductivity to that associated with said first material region.

27. A camera tube in accordance with claim 26, wherein said cadmium selenide is substantially polycrystalline and includes multiple crystallographic phases.

28. A camera tube in accordance with claim 27, additionally comprising an overlayer on said second material region of a high resistance chalcogenide compound having a resistivity of greater than $10^8$ ohm-cm.

29. A camera tube in accordance with claim 28, wherein said high resistance compound consists of a material selected from the group consisting of zinc sulfide, arsenic disulfide, arsenic trisulfide, arsenic triselenide, thallium sulfide, thallium selenide, zinc selenide, cadmium telluride, antimony trisulfide, antimony triselenide, and mixtures thereof.

30. A camera tube in accordance with claim 29, wherein an inner surface of said transparent portion includes a transparent electrically conductive film having a major surface in electrical contact with said cadmium selenide region of said target.

* * * * *